(12) United States Patent
Kim et al.

(10) Patent No.: US 7,791,939 B2
(45) Date of Patent: Sep. 7, 2010

(54) NON-VOLATILE MEMORY DEVICE

(75) Inventors: You Sung Kim, Seoul (KR); Jun Rye Rho, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 145 days.

(21) Appl. No.: 12/119,412

(22) Filed: May 12, 2008

(65) Prior Publication Data
US 2009/0231916 A1  Sep. 17, 2009

(30) Foreign Application Priority Data
Mar. 14, 2008  (KR) ............... 10-2008-0023839

(51) Int. Cl.
*G11C 16/00* (2006.01)
(52) U.S. Cl. .................. 365/185.05; 365/185.03
(58) Field of Classification Search ............... 365/168, 365/185.12
See application file for complete search history.

(56) References Cited

U.S. PATENT DOCUMENTS

| | | | | |
|---|---|---|---|---|
| 5,966,326 A | * | 10/1999 | Park et al. ............ | 365/185.11 |
| 6,075,723 A | * | 6/2000 | Naiki et al. ............ | 365/185.03 |
| 6,728,133 B2 | * | 4/2004 | Shimizu ............... | 365/185.03 |
| 7,180,775 B2 | * | 2/2007 | Meir .................. | 365/185.03 |
| 7,518,914 B2 | * | 4/2009 | Han ................... | 365/185.05 |

FOREIGN PATENT DOCUMENTS

| | | |
|---|---|---|
| JP | 2003-022687 | 1/2003 |
| KR | 100205240 B1 | 4/1999 |
| WO | WO2008/082888 | 7/2008 |

\* cited by examiner

*Primary Examiner*—Tan T. Nguyen
(74) *Attorney, Agent, or Firm*—Townsend and Townsend and Crew LLP

(57) ABSTRACT

A non-volatile memory device increases a number of word lines and a storage capacity using a multi level cell. The non-volatile memory device addresses a problem of self-boosting not being adequately generated due to the increased number of word lines. The non-volatile memory device includes a memory cell array configured to have first memory cells for storing first bit information coupled to third word lines except a first word line adjacent to a drain select line and a second word line adjacent to a source select line, and second memory cells coupled to the first word line and the second word line. The second memory cells store second bit information that is smaller than the first bit information.

7 Claims, 5 Drawing Sheets

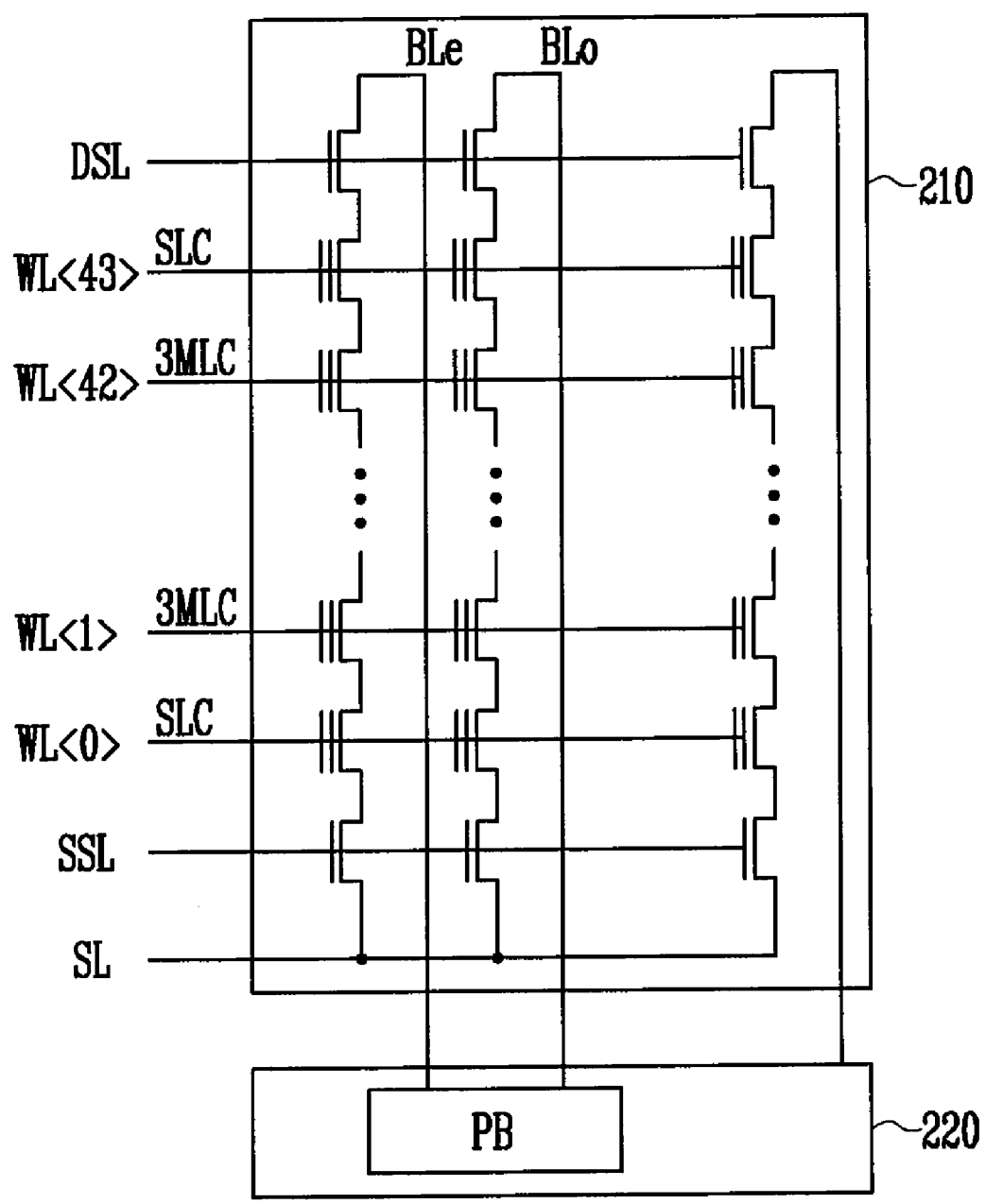

US 7,791,939 B2

NON-VOLATILE MEMORY DEVICE

CROSS-REFERENCE TO RELATED APPLICATIONS

This application claims priority from Korean Patent Application No. 10-2008-0023839, filed on Mar. 14, 2008, the contents of which are incorporated herein by reference in its entirety.

BACKGROUND OF THE INVENTION

The present invention relates to a non-volatile memory device. More particularly, the present invention relates to a non-volatile memory device for increasing storage capacity of data by augmenting a number of word lines of a memory device.

Generally, a flash memory device such as a non-volatile memory device is divided into categories of an NAND flash memory device and an NOR flash memory device.

In the NOR flash memory, each of the memory cells is connected independently to a bit line and a word line. Thus, the NOR flash memory has an excellent random access time. In the NAND flash memory, only one contact is required for one cell string because memory cells are connected in series in the cell string. Thus, the NAND flash memory exhibits excellent integration characteristics. Accordingly, the NAND flash memory has been generally employed in high density flash memory.

The NAND flash memory device includes a memory cell array, a row decoder and a page buffer.

The memory cell array has word lines disposed along rows, bit lines disposed along columns, and cell strings corresponding to each of the bit lines.

Recently, multi bit cells for storing a plurality of data bits in one memory cell have been actively studied to enhance the degree of integration of flash memory. This memory cell is referred to as a multi level cell (hereinafter, referred to as "MLC"). A memory cell for storing one data bit is referred to as a single level cell SLC.

The MLC has a plurality of threshold voltage distributions to store plural data. The data is differently stored in accordance with each of the cell distribution voltages.

Generally, the flash memory device has a structure in which memory cells are selected by the word lines and the bit lines.

Each of the bit lines is connected to a corresponding cell string in which memory cells are connected in series.

The word line connected to a gate of the memory cell in the cell string is disposed in a direction vertical to the bit line.

One cell string has sixteen memory cells or thirty two memory cells connected in series. The number of word lines is determined in accordance with the number of memory cells.

The bit lines are divided into even bit lines and odd bit lines.

Accordingly, when one memory block in the flash memory device is made up of cell strings having thirty two memory cells, the number of pages in the flash memory device is varied in accordance with the number of data bits stored in each of the memory cells.

FIG. 1A to FIG. 1C are views illustrating threshold voltage distributions of the memory cells in the flash memory device. FIG. 1A shows a threshold voltage distribution of a flash memory device including the SLC for storing one bit data information. FIG. 1B illustrates a threshold voltage distribution of a flash memory device having an MLC for storing 2 bit data information. FIG. 1C shows a threshold voltage distribution of a flash memory device including an MLC for storing 3 bit data information.

In FIG. 1A, the flash memory device including the SLC for storing one bit data information has one physical page and one logic page. In addition, erased memory cells are converted into programmed memory cells through a program operation. Accordingly, the flash memory device has two threshold voltage distributions.

In FIG. 1B, the flash memory device including the MLC for storing two bit data information has one physical page and two logic pages. Each of the pages is divided into a least significant bit page corresponding to a lower page and a most significant bit page corresponding to an upper page. The MLCs for storing two bit data information have fourth threshold voltage distributions through a program operation. The threshold voltage distributions include an erase status.

In FIG. 1C, the flash memory device including the MLC for storing three bit data information has one physical page and three logic pages. Each of the pages is divided into a lower page, an upper page and a higher page. In addition, the MLCs for storing three bit data information have eight threshold voltage distributions through a program operation. The threshold voltage distributions include erase status.

The number of the logic pages corresponding to the physical page and the number of the threshold voltage distributions are varied in accordance with the number of data bits stored in the memory cell as shown in FIG. 1A to FIG. 1C.

Accordingly, the number of bits stored in the memory cells should be increased to augment the data storage capacity of the flash memory device having a preset number of word lines and bit lines.

However, since the number of the threshold voltage distributions is increased as the number of bits stored in the memory cell is augmented as shown in FIG. 1A to FIG. 1C, an interval between the threshold voltages and a width of the threshold voltage distributions is narrowed.

It is difficult to control the interval between the threshold voltages and the width of the threshold voltage distributions as the number of data bits is increased.

Another method of increasing data storage capacity of the flash memory device augments the number of bit lines and word lines. However, this method may be used only if problems such as those related to a size of a memory device chip and those related to voltage control for a cell boosting operation in a program operation are solved.

SUMMARY OF THE INVENTION

It is a feature of the present invention to provide a non-volatile memory device for increasing a number of word lines and a storage capacity using a multi level cell.

A non-volatile memory device according to one example embodiment of the present invention includes a memory cell array configured to have first memory cells for storing first bit information coupled to third word lines, the first memory cells not being coupled to a first word line adjacent to a drain select line and a second word line adjacent to a source select line; and second memory cells coupled to the first word line and the second word line, wherein the second memory cells store second bit information that is smaller than the first bit information.

The second memory cells coupled to the first word line and the second word line are single level cells.

The second memory cells store two bit information.

The second bit information is smaller than the first bit information by at least one bit.

A non-volatile memory device having a memory cell array including a first word line to an Nth word line according to another example embodiment of the present invention includes first memory cells coupled to the Nth word line adjacent to a drain select line and the first word line adjacent to a source select line, and configured to store one bit information; and second memory cells coupled to the second word line to the (N−1)th word line and configured to store 3 bit information.

A non-volatile memory device having a memory cell array including a first word line to an Nth word line according to still another example embodiment of the present invention includes first memory cells coupled to the first word line adjacent to a source select line and configured to store two bit information; and second memory cells coupled to the second word line to the Nth word line and configured to store 3 bit information.

A non-volatile memory device having a memory cell array having a first word line to an Nth word line according to still another example embodiment of the present invention includes first memory cells coupled to the first word line to the (N−1)th word line and configured to store 3 bit information; and second memory cells coupled to the Nth word line adjacent to a drain select line and configured to store two bit information.

As described above, a non-volatile memory device of the present invention increases the number of word lines in a memory cell array and augments storage capacity using a multi level cell. In addition, the non-volatile memory device addresses a problem of self-boosting not being adequately generated due to the increased number of word lines.

BRIEF DESCRIPTION OF THE DRAWINGS

The above and other features and advantages of the present invention will become readily apparent by reference to the following detailed description when considered in conjunction with the accompanying drawings wherein:

FIG. 2B is a view illustrating circuitry of a memory cell array according to a first example embodiment of the present invention;

DESCRIPTION OF SPECIFIC EMBODIMENTS

Hereinafter, the preferred embodiments of the present invention will be explained in more detail with reference to the accompanying drawings.

Figure 1A:
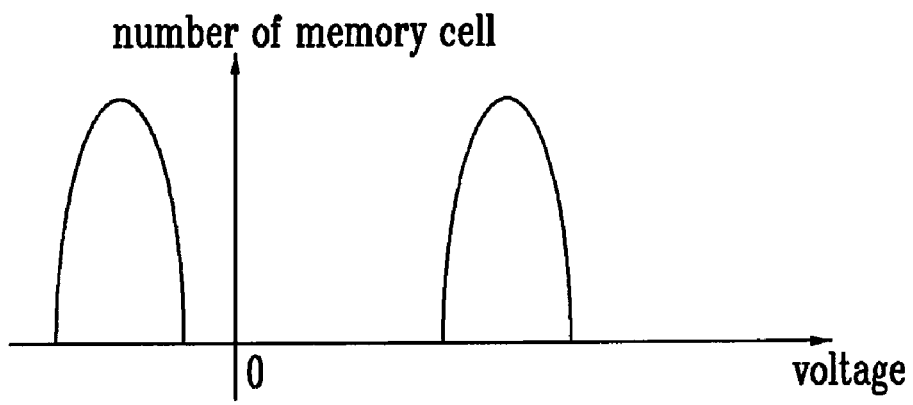
FIG. 1A to FIG. 1C are views illustrating threshold voltage distributions of memory cells in a flash memory device.
Figure 1B:
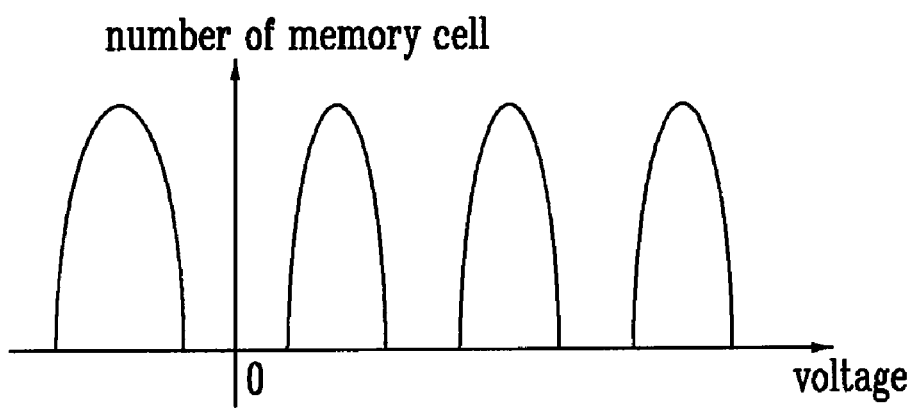
Figure 1C:
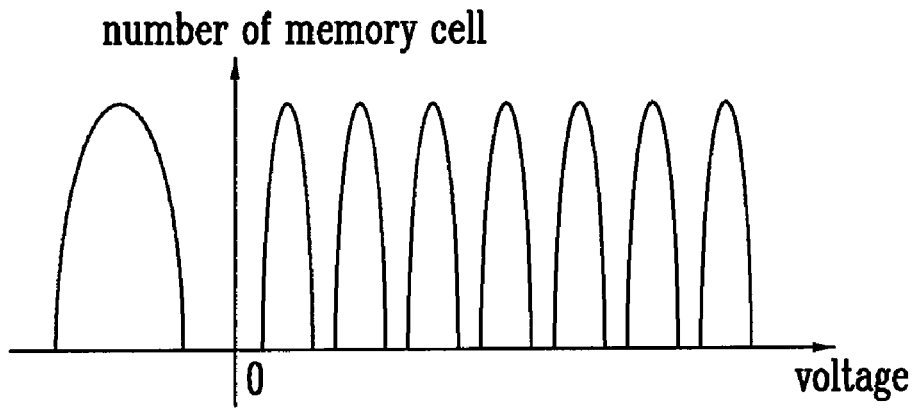
Figure 2A:
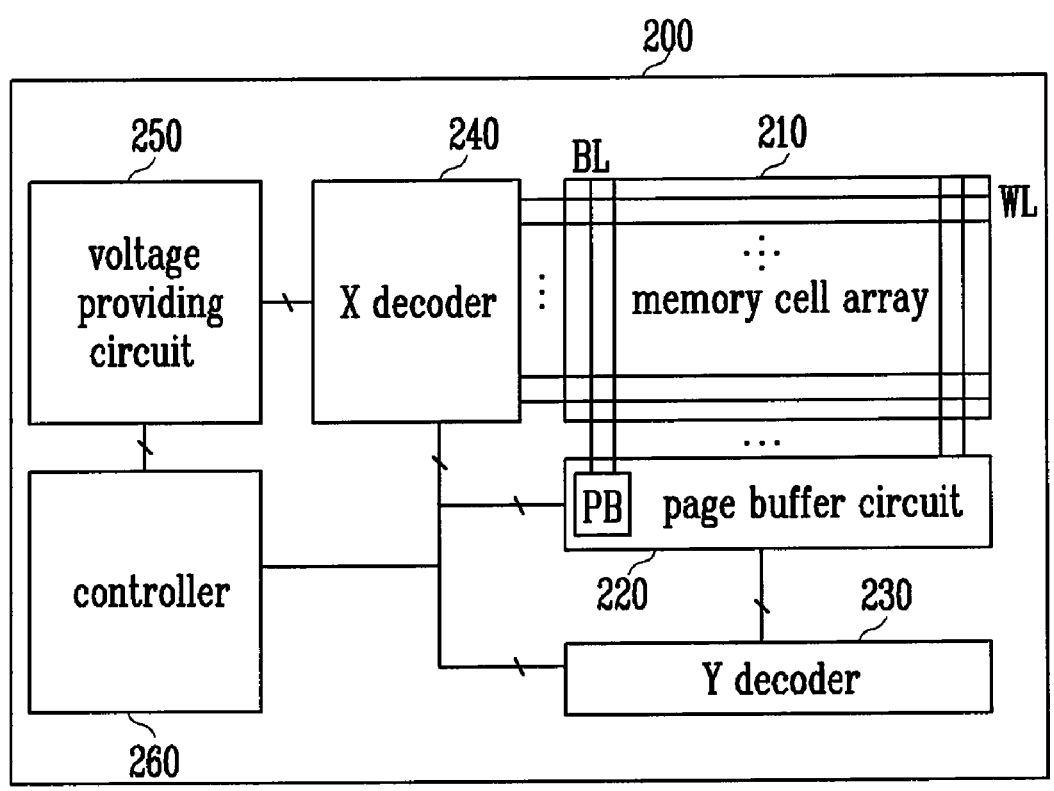
FIG. 2A is a block diagram illustrating a flash memory device.

FIG. 2A is a block diagram illustrating a flash memory device.

In FIG. 2A, the flash memory device 200 includes a memory cell array 210, a page buffer circuit 220, a Y decoder 230, an X decoder 240, a voltage providing circuit 250 and a controller 260.

The memory cell array 210 has cell strings in which memory cells for storing data are coupled in series. Each of the cell strings is coupled to a corresponding bit line BL. In addition, gates of the memory cells are coupled to corresponding word lines WL in a direction vertical to the bit lines BL.

The page buffer circuit 220 includes a plurality of page buffers PB coupled to the bit lines BL of the memory cell array 210. Each of the page buffers PB temporarily stores data to be programmed in a selected memory cell and then transmits the stored data to the memory cell through a corresponding bit line, or reads data from a given memory cell and stores the read data.

The Y decoder 230 provides an input/output path to the page buffers PB of the page buffer circuit 220 in accordance with an input address.

The X decoder 240 selects a word line of the memory cell array 210 in accordance with the input address.

The voltage providing circuit 250 generates an operation voltage to be provided to a word line coupled by the X decoder in accordance with control of the controller 260.

The controller 260 outputs a control signal in accordance with an operation command, and controls the voltage providing circuit 250 to provide a pass voltage in accordance with a data program step of the memory cell array 210.

A program operation in the flash memory device 200 is usually performed in a direction of a drain select line from a common source line.

The flash memory device 200 may increase the number of word lines of the memory cell array 210, and augment storage capacity of the memory cell array 210 by using an MLC.

FIG. 2B is a view illustrating circuitry of a memory cell array according to a first example embodiment of the present invention.

In FIG. 2B, the number of word lines of the memory cell array 210 of the present embodiment is increased to 44. In addition, the flash memory device 200 includes 256 logic pages using SLCs for storing one bit information and MLCs for storing 3 bit information.

In one cell string, forty-four memory cells are coupled in series between a drain select transistor DST and a source select transistor SST.

Gates of the drain select transistors DST are coupled to the drain select line DSL, and gates of the source select transistor SST are coupled to the source select line SSL.

Gates of the memory cells are coupled to a first word line WL<0> to a forty-fourth word line WL<43>. In this case, a memory cell coupled to the forty-fourth word line WL<43> adjacent to the drain select line DSL and a memory cell coupled to the first word line WL<0> adjacent to the source select line SSL operate as a SLC.

Memory cells coupled to the second word line WL<1> to the forty-third word line WL<42> operate as a MLC for storing 3 bit information.

Hence, the memory cell array 210 of the present embodiment has the logic page described below in Table 1.

TABLE 1

| | Word line | | page | | Bit/cell | even | odd | Total page |
|---|---|---|---|---|---|---|---|---|
| 44 | WL<43> | lower | | | 1 | 128 | 128 | 256 |
| 43 | WL<42> | lower | upper | higher | 3 | | | |
| . | ... | lower | upper | higher | 3 | | | |
| . | | | | | | | | |
| . | | | | | | | | |
| 2 | WL<1> | lower | upper | higher | 3 | | | |
| 1 | WL<0> | lower | | | 1 | | | |

As shown in Table 1, since the first word line WL<0> and the forty fourth word line WL<43> are SLCs, one logic page corresponds to each of the word lines WL<0> and WL<43> in the flash memory device. In addition, since the second word line WL<1> to the fourth-third word line WL<42> are MLCs for storing 3 bit information, three logic pages (i.e., a lower page, an upper page and a higher page) correspond to each of the second word line WL<1> to the fourth-third word line WL<42> in the flash memory device.

Accordingly, 128 logic pages corresponding to the even bit line and 128 logic pages corresponding to the odd bit line (i.e., 256 logic pages) are included in the flash memory device.

Figure 2C:
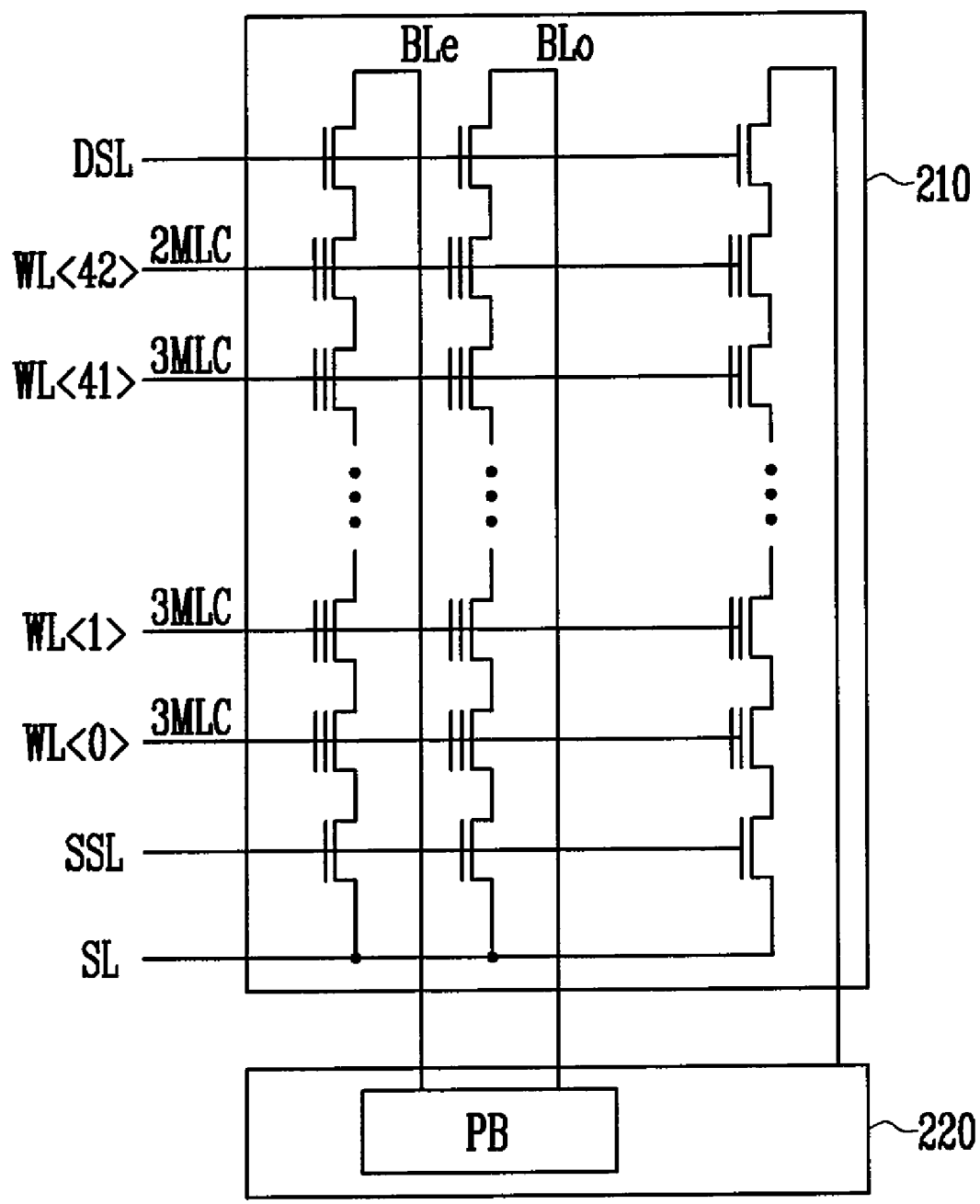
FIG. 2C is a view illustrating circuitry of a memory cell array according to a second example embodiment of the present invention.

FIG. 2C is a view illustrating circuitry of a memory cell array according to a second example embodiment of the present invention.

In FIG. 2C, the memory cell array 210 of the present embodiment has 43 word lines, an MLC for storing 2 bit information (i.e., 2MLC) and MLCs for storing 3 bit information (i.e., 3MLC).

Memory cells coupled to the forty-third word line WL<42> adjacent to the drain select line DSL of the word lines WL<0> to WL<42> operate as an MLC for storing 2 bit information. Memory cells coupled to the other word lines WL<0> to WL<41> operate as an MLC for storing 3 bit information.

Accordingly, the memory cell array 210 of the present embodiment is made up of logic pages as shown below in Table 2.

TABLE 2

| | Word line | page | | Bit/cell | even | odd | Total page |
|---|---|---|---|---|---|---|---|
| 43 | WL<42> | lower | upper | | 2 | 128 | 128 | 256 |
| 42 | WL<41> | lower | upper | higher | 3 | | | |
| | . . . | lower | upper | higher | 3 | | | |
| 2 | WL<1> | lower | upper | higher | 3 | | | |
| 1 | WL<0> | lower | upper | higher | 3 | | | |

Referring to Table 2, MLCs for storing 2 bit information coupled to the forty-third word line WL<42> have two logic pages, i.e. a lower page and an upper page. In addition, MLCs for storing 3 bit information coupled to the word lines WL<0> to WL<41> have three logic pages, i.e. a lower page, an upper page and a higher page.

Accordingly, 128 logic pages corresponding to the even bit line and 128 logic pages corresponding to the odd bit line (i.e., 256 logic pages) are included in the flash memory device.

In another example embodiment of the present invention, the memory cell array 210 may have a structure different from the above structure as long as the memory cell array 210 made up of forty three word lines has 256 logic pages.

Figure 2D:
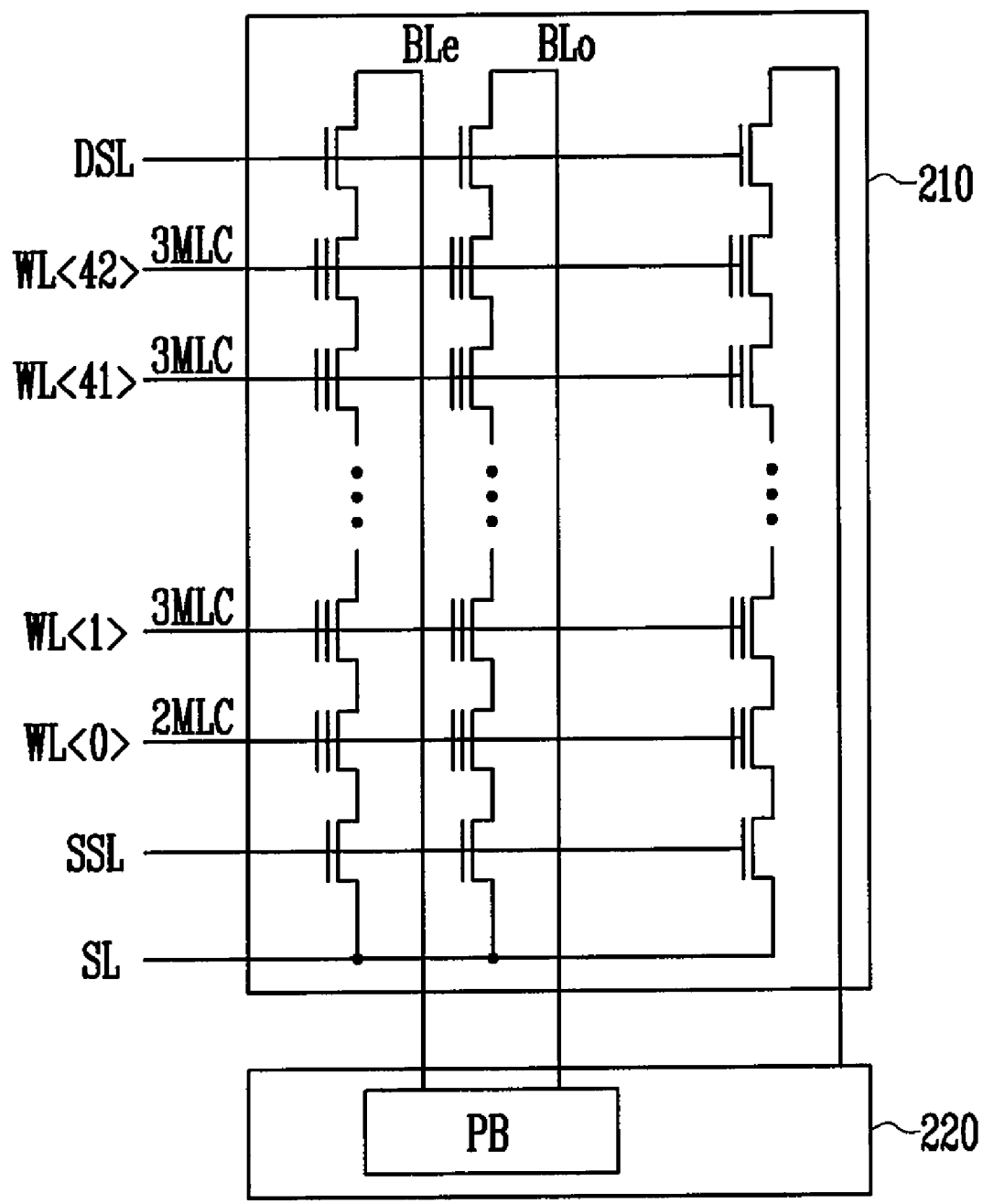
FIG. 2D is a view illustrating circuitry of a memory cell array according to a third example embodiment of the present invention.

FIG. 2D is a view illustrating circuitry of a memory cell array according to a third example embodiment of the present invention.

In FIG. 2D, the memory cell array 210 of the present embodiment has 43 word lines, MLCs for storing 2 bit information and MLCs for storing 3 bit information.

Memory cells coupled to the first word line WL<0> adjacent to the source select line SSL of the word lines WL<0> to WL<42> operate as an MLC for storing 2 bit information. Memory cells coupled to the other word lines WL<1> to WL<42> operate as an MLC for storing 3 bit information.

Accordingly, the memory cell array 210 of the present embodiment is made up of logic pages as shown below in Table 3.

TABLE 3

| | Word line | page | | Bit/cell | even | odd | Total page |
|---|---|---|---|---|---|---|---|
| 43 | WL<42> | lower | upper | higher | 3 | 128 | 128 | 256 |
| 42 | WL<41> | lower | upper | higher | 3 | | | |
| | . . . | lower | upper | higher | 3 | | | |
| 2 | WL<1> | lower | upper | higher | 3 | | | |
| 1 | WL<0> | lower | upper | | 2 | | | |

Referring to Table 3, MLCs for storing 2 bit information coupled to the first word line WL<0> have two logic pages, i.e. a lower page and an upper page. In addition, MLCs for storing 3 bit information coupled to the word lines WL<1> to WL<42> have three logic pages, i.e. a lower page, an upper page and a higher page.

Accordingly, 128 logic pages corresponding to the even bit line and 128 logic pages corresponding to the odd bit line (i.e., 256 logic pages) are included in the flash memory device.

A problem exists in that self-boosting for program prohibition is not generated adequately in the first embodiment to the third embodiment in FIG. 2B to FIG. 2D. To solve the problem, the flash memory device of the present invention assigns memory cells for storing specific bit information to word lines adjacent to the drain select line DSL or the source select line SSL. The specific bit information is smaller than the bit information corresponding to the other word lines.

That is, the memory cell array has MLCs for storing 3 bit information. However, memory cells coupled to the word line adjacent to the source select line SSL or the drain select line DSL, of which distribution characteristics may be deteriorated, store one bit information or two bit information. Accordingly, distribution characteristics of the word lines may be enhanced.

Any reference in this specification to "one embodiment," "an embodiment," "example embodiment," etc., means that a particular feature, structure, or characteristic described in connection with the embodiment is included in at least one embodiment of the invention. The appearance of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to the variations and modifications in the component parts and/or arrangements, alternative uses will also be apparent to those skilled in the art.

What is claimed is:

1. A non-volatile memory device comprising:
   a memory cell array configured to have first memory cells, for storing first bit information, coupled to third word lines, the first memory cells not being coupled to a first word line adjacent to a drain select line and a second word line adjacent to a source select line; and second memory cells coupled to the first word line and the second word line, wherein the second memory cells store second bit information that is smaller than the first bit information.

2. The non-volatile memory device of claim 1, wherein the second memory cells are single level cells.

3. The non-volatile memory device of claim 1, wherein the second memory cells store two bit information.

4. The non-volatile memory device of claim 1, wherein the second bit information is smaller than the first bit information by at least one bit.

5. A non-volatile memory device having a memory cell array including a first word line to an Nth word line, the non-volatile memory device comprising:

first memory cells coupled to the Nth word line adjacent to a drain select line and the first word line adjacent to a source select line, and configured to store one bit information; and second memory cells coupled to the second word line to the (N−1)th word line and configured to store 3 bit information.

6. A non-volatile memory device having a memory cell array having a first word line to an Nth line, the non-volatile memory device comprising:

first memory cells coupled to the first word line adjacent to a source select line and configured to store two bit information; and second memory cells coupled to the second word line to the Nth word line and configured to store 3 bit information.

7. A non-volatile memory device having a memory cell array having a first word line to an Nth word line, the non-volatile memory device comprising:

first memory cells coupled to the first word line to the (N−1)th word line and configured to store 3 bit information; and second memory cells coupled to the Nth word line adjacent to a drain select line and configured to store two bit information.

* * * * *